March 2, 1965 R. B. DOME 3,172,052

CONSTANT BANDWIDTH AMPLIFIER

Filed Jan. 6, 1961

INVENTOR:
ROBERT B. DOME,
BY Joseph Levinson
HIS ATTORNEY.

United States Patent Office 3,172,052

Patented Mar. 2, 1965

3,172,052

CONSTANT BANDWIDTH AMPLIFIER

Robert B. Dome, Geddes Township, Onondaga County, N.Y., assignor to General Electric Company, a corporation of New York Filed Jan. 6, 1961, Ser. No. 81,073
2 Claims. (Cl. 330—129)

The present invention relates to electrical signal amplifying apparatus and more particularly to an improvement in a grounded-grid amplifier whereby the bandwidth of the amplifier is maintained at a relatively constant value when the gain of the amplifier is varied.

In the ultra-high frequency range, the grounded-grid triode amplifier is used extensively as a wide-band amplifier. Particular use is made of this amplifier configuration in television receivers and other related high frequency applications. The grounded-grid amplifier exhibits a primarily resistive input impedance. This means that, unlike other amplifier configurations wherein the input impedance is primarily reactive and in which case the reactance may be included as part of an associated resonant circuit, the resistive input impedance of a grounded-grid amplifier cannot be tuned out.

It is known that in extending the bandwidth of tuned circuits, a dissipative impedance may be connected in the tuned circuit. This dissipative impedance increases the frequency difference between the half power points of the response characteristic with, of course, a resulting reduction in the amplitude of the output voltage. In a grounded-grid amplifier arrangement, the input impedance of a stage, which is primarily resistive, has been connected so as to provide this function of a loading impedance in an associated tuned circuit. Since the input impedance will therefore determine to a large extent the Q of the associated tuned circuit, and since the amplifier bandwidth is a function of circuit Q, any change in this impedance will result in a change in bandwidth. Because of this variation in bandwidth, prior grounded-grid amplifiers have been satisfactory only under limited conditions of operation; namely, when the gain of the amplifier is maintained constant or when significant variations in bandwidth could be tolerated. More specifically, it is known that the input impedance of the grounded-grid amplifier is primarily resistive, as has already been stated, and that this input impedance is given approximately by the following relation:

$$Z_{in}=\frac{r_p+Z_o}{\mu+1}$$

where $Z_{in}$ is the input impedance of the grounded-grid amplifier in ohms, $r_p$ is the tube internal plate resistance in ohms, $\mu$ is the non-dimensional tube amplification factor and $Z_o$ is the external plate load impedance in ohms. In the usual situation, $r_p$ is generally much larger in value than $Z_o$. Therefore, $Z_{in}$ is almost directly proportional to the value of $r_p$. In a triode vacuum tube, $r_p$ changes with variations in the control electrode to cathode voltage. Thus, by changing the value of control electrode to cathode voltage, as would be the case in a well-known method for changing the gain of the amplifier, $Z_{in}$ will vary. Prior attempts to include this resistive input impedance, $Z_{in}$, in the associated tuned circuits have, thus, generally resulted in an undesirable change in the band-pass characteristic of the amplifier owing to this change in input impedance with changes in the gain of the amplifier.

It is therefore an object of this invention to provide an improved grounded-grid amplifier in which the band-pass of the amplifier remains relatively constant with changes in the gain of the amplifier.

It is also an object of this invention to provide an improved ultra-high frequency band-pass amplifier.

In accordance with the present invention, a two-stage amplifier is provided in which the amplifying devices of each stage are connected in a grounded-grid configuration. Each stage has an associated input network and each input network includes a tuned circuit resonant to the same frequency. The connection of the amplifying devices and the associated networks is such that when the gain of the stages is varied simultaneously in the same manner, the input impedances of the amplifying devices load the associated tuned circuits in such manner as to increase the Q of one of the tuned circuits and decrease the Q of the other tuned circuit thereby maintaining the bandwidth of the over-all amplifier relatively constant.

Further objects, features and attending advantages of the invention will be apparent with reference to the following specifications and drawings, in which.

Figure 1:
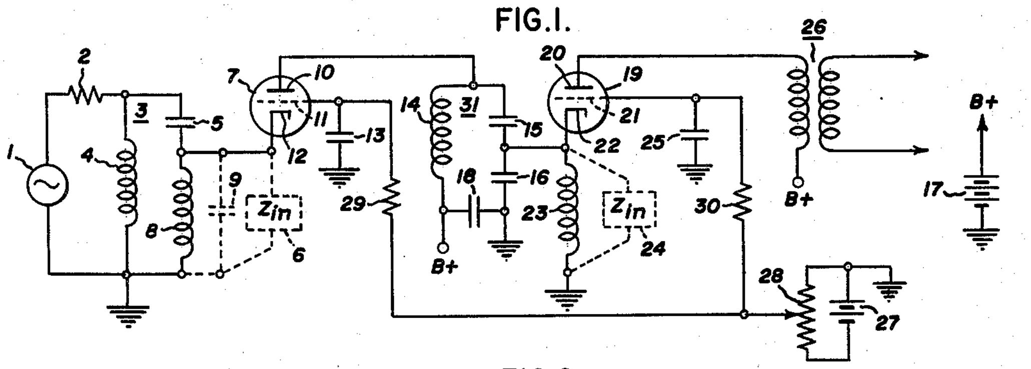
FIGURE 1 is a circuit diagram showing a grounded-grid ultra-high frequency amplifier embodying the novel features of this invention.

Referring now to FIGURE 1, a two-stage ultra-high frequency amplifier is illustrated including a source of signals 1 having an internal resistance 2 connected to a tuned circuit 3 consisting of a tuning inductor 4 in parallel with a capacitive branch consisting of a tuning capacitor 5 in series with the input impedance 6 of electron discharge device 7. An inductor 8, which tunes out stray input capacitance, is connected in parallel with the input impedance 6. Capacitance 9 represents stray capacitance and other capacitive reactance existing in the input circuit of electron discharge device 7.

The electron discharge device 7 has an anode 10, a control electrode 11, and a cathode 12. The control electrode 11 is maintained at ground potential for the alternating voltage signals by capacitor 13. The anode to ground circuit comprises a tuned circuit 31 having an inductor 14 connected in parallel with a capacitor 15 and a capacitor 16 which are connected in series. Capacitor 16 is chosen so as to include any capacitive reactance existing in the input circuit of electron discharge device 19. A source of plate voltage 17 is connected to anode 10 via inductor 14. Capacitor 18 by-passes any alternating signal voltage from reaching the power supply 17.

Electron discharge device 19 has an anode 20, a control electrode 21 and a cathode 22. An inductor 23 connects cathode 22 to ground potential and is connected in parallel with the resistive input impedance 24. Signal voltage amplified by electron discharge device 7 is derived from the junction of capacitor 15 and capacitor 16 and applied to the cathode to ground circuit of electron discharge device 19. Capacitor 25 maintains control electrode 21 at ground potential for alternating signal voltage. The anode 20 of electron discharge device 19 is connected to a load circuit shown to be the primary winding of a transformer 26, the secondary winding of which may be connected to a receiver mixer circuit (not shown). Plate voltage is supplied to anode 20 of electron discharge device 19 via the primary winding of transformer 26.

A control electrode bias voltage is provided by voltage supply 27. Potentiometer 28 is provided in order to select a portion of this voltage for application to control electrodes 11 and 21 of electron discharge devices 7 and 19 respectively via isolation resistors 29 and 30 respectively.

Referring now to the operation of the circuit of FIGURE 1 as a whole and neglecting, for the moment, the detailed operation of the circuit, the first network having a tuned circuit 3 resonant to a frequency $f_0$ is connected in the input circuit of the first stage of the amplifier illustrated in FIGURE 1. A second network having a tuned circuit 31 and resonant to the same frequency $f_0$ is connected in the input circuit of the second stage of the amplifier. Each of these tuned circuits has a Q determined largely by the resistive input impedance of the associated amplifying device. The tuned circuits are connected to the input circuit of the amplifying devices in such a manner that when the Q of the tuned circuit of one stage is increased or decreased because of a variation in input impedance, the Q of the tuned circuit of the other stage is simultaneously varied but in an opposite manner. More specifically, as the Q of one stage increases the Q of the other stage decreases. The connection of the tuned circuits to the input circuit includes the resistive input impedance as a series loading resistance in one stage and as a parallel loading resistance in the other stage in order to obtain the desired opposite changes in the Q of the circuits. The variations in input impedances are caused, as has been shown, by variations in the plate resistance of the electron discharge device which, in turn, is caused by a variation in the control electrode to cathode voltage. This change in control electrode to cathode voltage is effected by suitable manual or automatic gain control means. The bias control potentiometer 28 of FIGURE 1 illustrates a suitable manual gain control.

Referring now in more detail with reference to FIGURE 1, the tuned circuit 3 which is resonant to a frequency $f_0$ comprises an inductive branch having an inductance 4 and a capacitive branch comprising a capacitor 5 in series connection with the parallel combination comprising inductor 8, capacitance 9 and input impedance 6. Inductor 8 resonates with capacitance 9 at the signal frequency. In the usual case, a resonating parallel circuit appears resistive. Thus, the resistance former by this parallel resonant circuit connected in parallel with the resistive input impedance 6 forms an equivalent resistance which is connected in series with capacitor 5. The inductor 4 and capacitor 5 are selected to cause the tuned circuit 3 to be parallel resonant at the desired frequency, $f_0$. It is known that the Q of a circuit is inversely proportional to the energy dissipated in the circuit. By increasing the value of a resistance in a series connection with a reactive component, the dissipation is increased and the Q of the circuit is correspondingly decreased. In accordance with a feature of this invention, as the gain of the first stage is reduced by varying the arm of potentiometer 28 and making the control electrode to cathode voltage more negative, the plate resistance $r_p$ of electron discharge device 7 increases, $Z_{in}$ increases and the equivalent resistance in series with capacitor 5 in the capacitive branch increases, thereby reducing the Q of the tuned circuit 3.

The tuned circuit 31 in the input circuit of electron discharge device 19 which is resonant to the same frequency $f_0$ as tuned circuit 3 includes an inductive branch comprising inductor 14 connected in parallel with a capacitive branch comprising series connected capacitors 15 and 16. Capacitor 16 includes any stray capacitance in the input circuit of electron discharge device 19. An inductor 23 connects the cathode 22 to ground potential. This inductor 23 has no effect on the tuning of the resonant circuit and is included only to provide a path to ground for the D.C. component of the plate current of electron discharge device 19. The capacitors 15 and 16 provide an effective capacitance in parallel with inductor 14. The values of capacitors 15 and 16 and inductor 14 are selected so as to cause tuned circuit 31 to be parallel resonant at the desired frequency, $f_0$. One of the series connected capacitors, capacitor 16, is connected in parallel with the input impedance of electron discharge device 19. The input impedance is thus effectively placed in parallel with the inductive and capacitive branches of the tuned circuit 31 and stepped up in magnitude by the series capacitive network comprising capacitors 15 and 16. In accordance with a feature of this invention, this increased value of resistance appears in parallel with the parallel tuned circuit 31. As the control electrode to cathode voltage is made more negative, the plate resistance $r_p$ of device 19 increases, $Z_{in}$ increases and the parallel resistance increases. This increase in resistance reduces the dissipation of the parallel tuned circuit resulting in an increase in the Q of this circuit.

As the gain of the over-all amplifier is reduced by increasing the bias voltage on each electron discharge device by the operation of potentiometer 28, the Q of the tuned circuit of the first stage will decrease and would result in an undesirable broadening of the amplifier bandwidth characteristic. This characteristic is normally defined as the difference in frequency between the half power points of the amplifier gain versus frequency characteristic. However, and in accordance with a feature of this invention, the Q of the resonant circuit of the second stage will concurrently increase resulting in maintaining the band-pass characteristic of the amplifier substantially constant.

Figure 3:
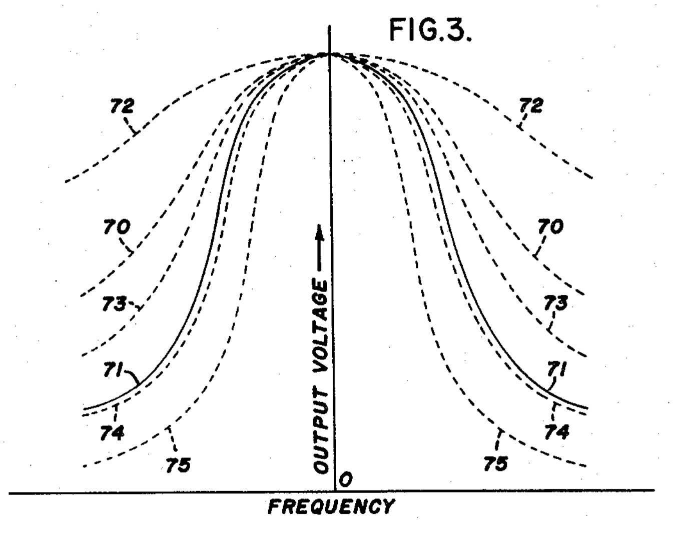
FIGURE 3 shows the band-pass characteristic of the individual and combined tuned circuits of FIGURE 1.

Referring now to FIGURE 3, the results of these changes in Q are graphically illustrated. Curve 70 represents the response of each of the two tuned circuits, 3 and 31, with low bias. As is well known, the bandwidth of cascaded tuned circuits has a resulting over-all bandwidth which is less than the bandwidth of the individual circuits. Thus, curves 70 multiply to give a resulting over-all response curve indicated by curve 71 for the cascaded stages. As the bias on the electron discharge devices increases, the Q of the individual circuits change in opposite ways. The result is depicted by curve 72 representing the response of tuned circuit 3 with increased series loading and by curve 73 representing the response of tuned circuit 31 with decreased parallel loading. It is easily seen that these response characteristics have changed with the change in bias from the original curve 70. The product or over-all response of the curves represented by curve 72 and curve 73 is given by curve 74, which is a close approximation to the original over-all response curve 71. Note that if both circuits had been alike in the kind of loading, i.e., both having either series loading or parallel loading, the final over-all curve 74 should have been either far too broad or far too narrow. The latter case is illustrated by multiplying curve 73 by itself giving over-all curve 75.

Figure 2:
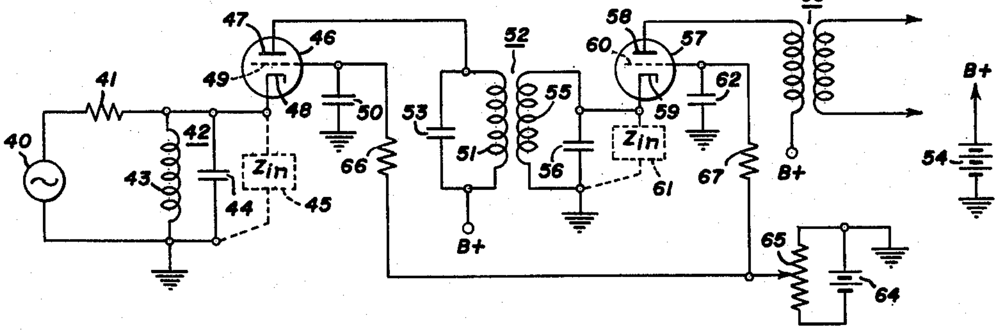
FIGURE 2 is an alternative circuit arrangement for practicing the features of this invention.

An alternative embodiment of this invention employing shunt loading of the tuned circuit in the first stage and shunt loading of a double tuned circuit in the input network for the second stage is illustrated in FIGURE 2. Referring to FIGURE 2, a source of signals 40 is shown having an internal impedance 41 connected to a tuned circuit 42 consisting of a tuning inductor 43 and capacitor 44 and shunted by the resistive input impedance 45 of electron discharge device 46. Capacitor 44 is chosen so as to include any stray capacitive reactance located in the input circuit of electron discharge device 46 as part of the capacitance branch of tuned circuit 42. Electron discharge device 46 has an anode 47, cathode 48, and control electrode 49. Inductor 43 resonates with capacitor 44 and any stray capacitance existing in the input circuit of electron discharge device 46. The control electrode 49 is maintained at ground potential for the alternating voltage signals by capacitor 50. The anode load circuit for electron discharge device 46 comprises the primary winding 51 of transformer 52 which is tuned by a parallel connected capacitor 53. A source of anode potential 54 is connected to anode 47 via the primary winding 51 of transformer 52. The secondary winding 55 of transformer 52 is tuned by parallel connected capacitor 56. Capacitor 56 includes any capacitive reactance which exists in the input circuit of electron discharge device 57.

Electron discharge device 57 has an anode 58, cathode 59 and control electrode 60. The resistive input impedance 61 of electron discharge device 57 is connected in parallel with the tuned circuit comprising secondary winding 55 and capacitor 56. Capacitor 62 maintains grid electrode 60 at ground potential for alternating voltage signals. The anode 58 of electron discharge 57 is connected to a load circuit shown to be the primary winding of transformer 63, the secondary winding of which may be connected to a receiver mixer circuit, not shown. Plate voltage is applied to anode 58 of electron discharge device 57 via the primary winding of transformer 63.

Control electrode bias voltage is provided by voltage supply 64. Potentiometer 65 is provided to select a portion of this bias voltage for application to control electrodes 49 and 60 of electron discharge devices 46 and 57 respectively via isolation resistors 66 and 67 respectively.

In operation, the tuned circuit 42 in the input network of the first stage is resonant to a frequency $f_0$ and is parallel loaded by the input impedance 45 of the first stage. As the input impedance 45 increases, the loading is reduced and the Q of the tuned circuit 42 increases. A tuned two-winding transformer 52, tuned to the same frequency $f_0$, with parallel loading of the secondary circuit by the input impedance 61 of the second stage, couples the signal being amplified from the first to the second stage. Such a tuned two-winding transformer wherein the primary and secondary circuits are both resonated to a same frequency is known as a double tuned circuit. When adjusting the degree of coupling for maximum band-pass while retaining a desirable gain characteristic, a valley generally appears in the response characteristic. In the arrangement illustrated here, increasing the input impedance 61 will produce a deeper valley in the response characteristic of the double tuned circuit. However, this valley will be filled to a fair degree by the sharper response of the single tuned circuit 42 in the input network of the first stage and the over-all bandwidth of the amplifier will remain essentially constant.

The circuits of FIGURE 1 and FIGURE 2 illustrate alternative means for maintaining the bandwidth of a grounded-grid amplifier with changes in the gain of the amplifier, the changes in gain being accomplished by varying the bias on each stage in a similar manner. FIGURE 1 illustrates a circuit which varies the Q of a single tuned circuit in one manner in a stage by series loading and which varies the Q of a single tuned circuit in an opposite meanner in another stage by shunt loading. FIGURE 2 illustrates a circuit which varies the Q of a single tuned circuit in one manner in a stage by shunt loading and which varies the Q of a double tuned circuit in an opposite manner in another stage by shunt loading.

While I have illustrated and described and have pointed out in the annexed claims certain novel features of my invention, it will be understood that various omissions, substitutions and changes in the form and details of the system illustrated may be made by those skilled in the art without departing from the spirit of the invention and the scope of the claims.

What I claim as new and desire to secure by Letters Patent of the United States is:

1. An ultra-high frequency band-pass amplifier comprising: a first amplifying device having an input impedance; a second amplifying device having an input impedance; a first electrical network coupled to said first amplifying device for applying a signal thereto; a second electrical network connected between said first and second amplifying devices for coupling said signal from said first amplifying device to said second amplifying device; said first electrical network including a first tuned circuit coupled in shunt with the input impedance of said first amplifying device; said second electrical network including a second tuned circuit having a transformer with a tuned primary winding and a tuned secondary winding coupled in shunt with said input impedance of said second amplifying device; and means for simultaneously varying the gain of said first and second amplifying devices whereby a band-pass characteristic of the amplifier remains essentially constant with variations in gain.

2. An ultra-high frequency band-pass amplifier having a band-pass characteristic which remains substantially constant with variations in gain, comprising: a first electron discharge amplifying device having cathode, anode and control electrodes arranged in a grounded-grid amplifier configuration; a second electron discharge amplifying device having cathode, anode and control electrodes arranged in a grounded-grid amplifier configuration; said first and second amplifying devices having first and second input impedances respectively; a source of alternating signals to be amplified; a first electrical network for coupling said alternating signals to the cathode electrodes of said first amplifying device; said first electrical network including a first tuned circuit coupled in parallel with said input impedance of said first amplifying device; a second electrical network coupled between the anode of said first amplifying device and the cathode of said second amplifying devices; said second network including a transformer having a tuned primary winding and a tuned secondary winding coupled in shunt with said input impedance of said second amplifying device; and means for simultaneously varying the gain of said first and second amplifying devices whereby the bandpass characteristics of the amplifier remain substantially constant with variations in gain.

References Cited by the Examiner

UNITED STATES PATENTS

| | | | |
|---|---|---|---|
| 2,680,788 | 6/54 | Hoxie | 330—129 |
| 2,890,293 | 6/59 | Van Overbeek | 330—21 |

ROY LAKE, *Primary Examiner.*

RUDOLPH V. ROLINEC, JOHN KOMINSKI, *Examiners.*